(12) United States Patent
Ancey et al.

(10) Patent No.: US 7,259,649 B2
(45) Date of Patent: Aug. 21, 2007

(54) SWITCHABLE INDUCTANCE

(75) Inventors: Pascal Ancey, Revel (FR); Daniel Saias, Paris (FR)

(73) Assignee: STMicroelectronics S.A., Montrouge (FR)

( * ) Notice: Subject to any disclaimer, the term of this patent is extended or adjusted under 35 U.S.C. 154(b) by 210 days.

(21) Appl. No.: 10/903,896

(22) Filed: Jul. 30, 2004

(65) Prior Publication Data

US 2005/0024178 A1   Feb. 3, 2005

(30) Foreign Application Priority Data

Aug. 1, 2003   (FR) .................................. 03 09576

(51) Int. Cl.
*H01F 5/00*   (2006.01)
(52) U.S. Cl. ................................... 336/200
(58) Field of Classification Search .............. 336/65, 336/83, 200, 232; 257/531; 335/78–86; 200/181; 337/102, 106
See application file for complete search history.

(56) References Cited

U.S. PATENT DOCUMENTS 4,035,695 A * 7/1977 Knutson et al. ............ 361/782
6,101,371 A * 8/2000 Barber et al. ................ 455/73
6,184,755 B1 * 2/2001 Barber et al. ............... 331/181
6,229,121 B1   5/2001 Jang et al.
6,366,186 B1   4/2002 Hill et al.
6,573,822 B2 * 6/2003 Ma et al. .................... 336/223
6,759,261 B2 * 7/2004 Shimokohbe et al. ......... 438/48

FOREIGN PATENT DOCUMENTS

WO   WO 03/052780 A   6/2003

OTHER PUBLICATIONS

French Search Report from French Patent Application 03/09576, filed Aug. 1, 2003.

* cited by examiner

*Primary Examiner*—Tuyen T. Nguyen
(74) *Attorney, Agent, or Firm*—Lisa K. Jorgenson; James H. Morris; Wolf, Greenfield & Sacks, P.C.

(57) ABSTRACT

A switchable inductance that can be formed in an integrated circuit, including a spiral interrupted between two first points connected to two terminals via two metallizations running one above the other, one of the two metallizations being deformable; a hollowing between the two metallizations; and a switching device capable of deforming the deformable metallization to separate or to put in contact said two metallizations.

12 Claims, 3 Drawing Sheets

SWITCHABLE INDUCTANCE

BACKGROUND OF THE INVENTION

1. Field of the Invention

The present invention relates to the field of inductances and more specifically of inductances of variable value, the inductances being formed from conductive tracks formed, for example, in metallization levels of integrated circuits.

2. Discussion of the Related Art

FIG. 1 is a diagram of an inductance comprising a spiral coil with intermediary taps. Such a coil is conventionally formed on a metal level of an integrated circuit. The coil comprises four spirals between an external terminal E and an internal terminal S. Terminal S is connected to a switch I1 via a line l1 shown in dotted lines and performed on a metal level different from the metal level used to form the coil. Intermediary points P1 and P2, located in this example at the level of the second and third coil spiral, are respectively connected to switches I2 and I3 via lines l2 and l3 formed on a level different from that of the coil. Terminal E of the coil and the terminals of switches I1 to I3 non-connected to the coil are connected to connection terminals and possibly to elements of the integrated circuit on which is formed the coil.

A disadvantage of this inductance is that the presence of lines l1 to l3 between the coil and the switches causes parasitic effects in the coil.

Another disadvantage of this inductance is that when switch I2 or I3 is activated, the unused end of the coil located beyond point P1 or point P2 causes parasitic effects in the "useful" portion of the coil located between point E and point P1 or point P2.

Accordingly, such an inductance is not adapted to the provision of several inductance values due to parasitic phenomena.

SUMMARY OF THE INVENTION

An object of the present invention is to provide an inductance capable of exhibiting several inductance values with few parasitic phenomena.

To achieve this and other objects, the present invention provides a switchable inductance, that can be formed in an integrated circuit, comprising: a spiral interrupted between two first points connected to two terminals via two metallizations running one above the other, one of the two metallizations being deformable; a hollowing between the two metallizations; and a switching device capable of deforming the deformable metallization to separate or to put in contact said two metallizations.

According to an embodiment of above-mentioned inductance, the switching device comprises: a cavity formed in a substrate; a conductive beam in suspense above the cavity, the conductive beam being the deformable metallization; a conductive strip placed at the bottom of the cavity, the conductive strip being the other one of said metallizations; and means for deforming the beam capable of putting in contact the beam and the conductive strip.

According to an embodiment of the above-mentioned inductance, the beam deformation means comprise multilayer blocks placed on the beam, each block comprising a conductive layer placed between an insulating layer and a layer of a material having an expansion coefficient different from that of the beam, activation means being capable of conducting a current in the conductive layer of each block to heat the beam and said material layer of each block.

According to an embodiment of the above-mentioned inductance, the inductance comprises a second spiral, the second spiral being interrupted between two second points connected to said terminals, the external spiral being interrupted and connected to connection terminals.

According to an embodiment of the above-mentioned inductance, the inductance comprises additional spirals, each of which is associated with another spiral by crossed metallizations, one of which is deformable and associated with one of the switching devices.

The foregoing objects, features and advantages of the present invention will be discussed in detail in the following non-limiting description of specific embodiments in connection with the accompanying drawings.

DETAILED DESCRIPTION

Figure 1:
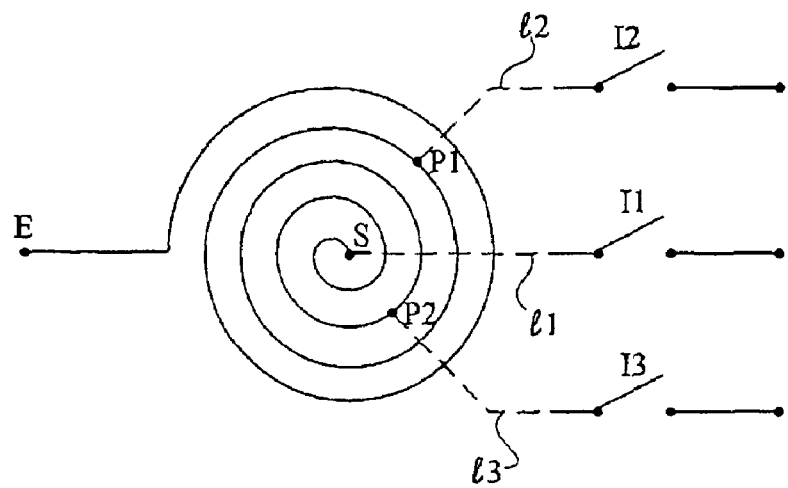
FIG. 1, previously described, is a simplified top view of an inductance comprising a spiral coil with intermediary taps according to prior art.
Figure 2:
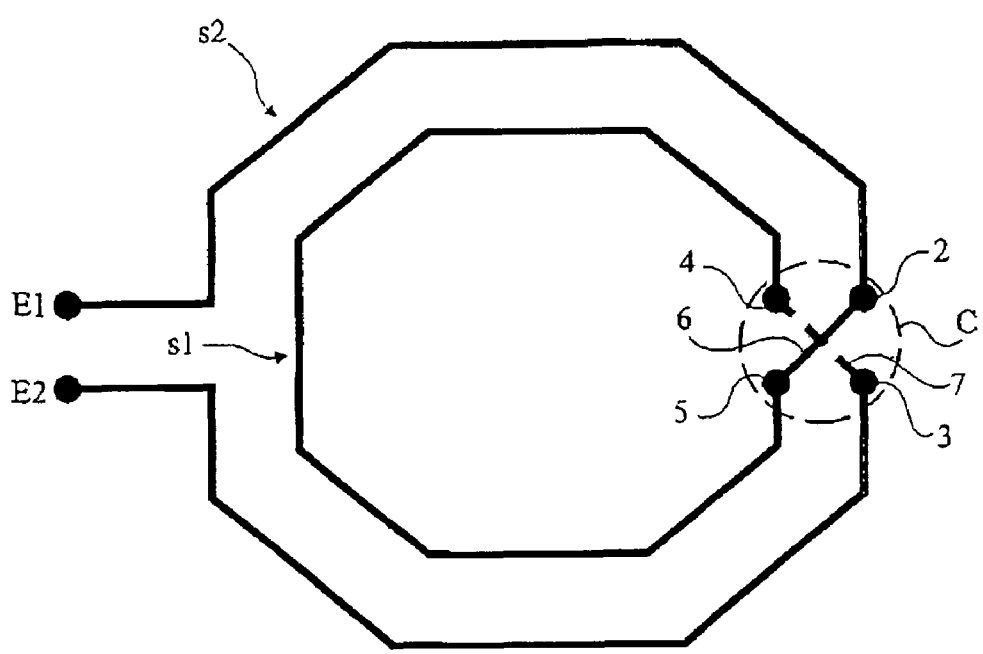
FIG. 2 is a simplified top view of a switchable inductance according to an embodiment of the present invention.

FIG. 2 is a simplified top view of a switchable inductance according to the present invention. This inductance comprises two concentric spirals, an internal spiral s1 and an external spiral s2. Spirals s1 and s2 are formed in a same metallization level. External spiral s2 is interrupted in a first region between two points connected to terminals E1 and E2, of connection of the inductance. Internal and external spirals s1 and s2 are interrupted in a second so-called switching region. In this second region, external spiral s2 is interrupted between points 2 and 3 and internal spiral s1 is interrupted between points 4 and 5. Points 2 and 5 are connected by a metallization 6 formed in the same metal level as internal and external spirals s1 and s2. Points 3 and 4 are connected by a metallization 7 running over or under metallization 6. A hollowing is formed between metallizations 6 and 7. Metallization 7 is deformable so that, when a switching device C shown in dotted lines and placed in the switching region is active, metallizations 6 and 7 are in contact.

When switching device C is inactive and metallization 6 and 7 are separated from each other, the inductance is a two-spirals inductance and the current flows between terminals E1 and E2 by running through a first portion of external spiral s2, through metallization 6, through internal spiral s1, through metallization 7 and through a second portion of external spiral s2.

When switching device C is active, metallizations 6 and 7 are interconnected and only external spiral s2 is active, internal spiral s1 being short-circuited.

Thus, according to whether switching device C is active or inactive, the inductance according to the present invention is an inductance with one spiral or an inductance with two spirals.

It should be noted that the switching region may be arranged at any chosen location of the spiral periphery. For example, it may be close to one of inputs E1 or E2 or, as shown, opposite to these inputs.

Figure 3:
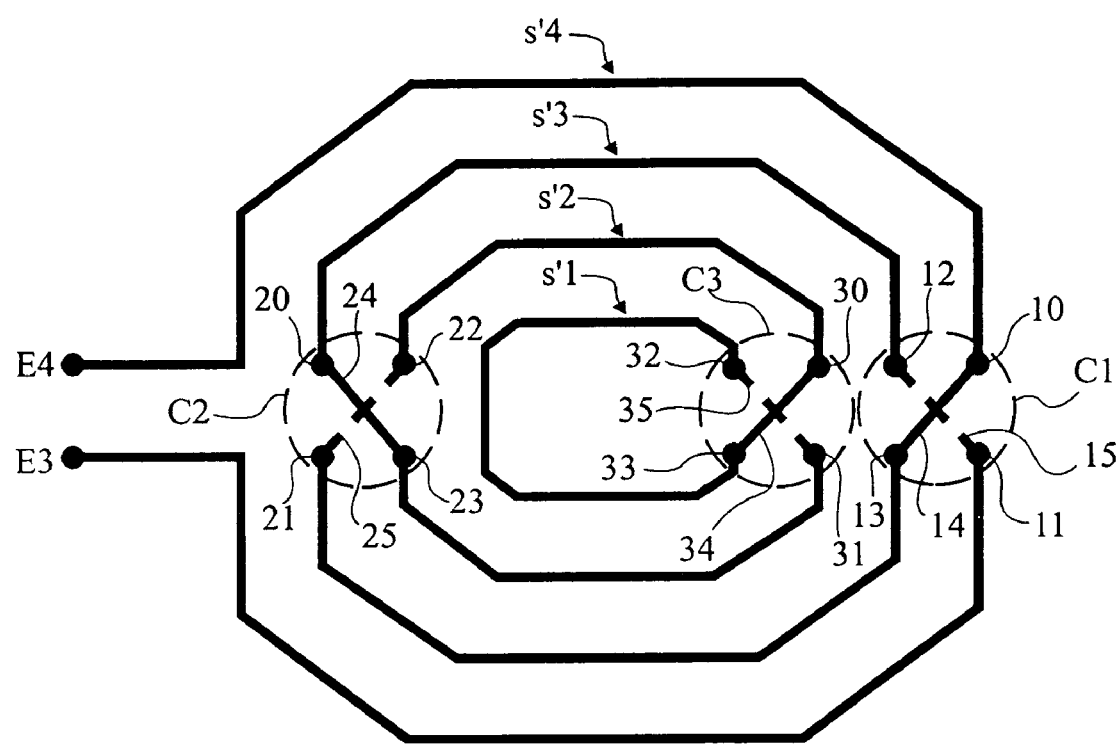
FIG. 3 is a simplified top view of a switchable inductance according to another embodiment of the present invention.

FIG. 3 is a simplified top view of an inductance according to another embodiment of the present invention. This inductance comprises four concentric spirals s'1, s'2, s'3, and s'4, spiral s'1 being the internal spiral and spiral s'4 being the external spiral. Spirals s'1 to s'4 are formed in a same metallization level. Spiral s'4 is interrupted between two points connected to inductance connection terminals E3 and E4. The most external spirals s'4 and s'3 are both interrupted in a first switching region associated with a switching device C1. In this first switching region, spiral s'4 is interrupted between points 10 and 11 and spiral s'3 is interrupted between points 12 and 13. Points 10 and 13 are connected by a metallization 14 formed in the same metal level as the assembly of spirals s'1 to s'4. Points 11 and 12 are connected by a metallization 15 running above or under metallization 14. A hollowing is formed between metallizations 14 and 15. Metallization 15 is deformable so that when switching device C1 is active, metallizations 14 and 15 are in contact.

Spirals s'3 and s'2 are interrupted in a so-called switching region associated with switching device C2. In this second region, spiral s'3 is interrupted between points 20 and 21 and spiral s'2 is interrupted between points 22 and 23. Points 20 and 23 are connected by a metallization 24 formed in the same metal level as the spiral assembly. Points 21 and 22 are connected by a metallization 25 running above or under metallization 24. A hollowing is formed between metallizations 24 and 25. Metallization 25 is deformable so that, when switching device C2 is active, metallizations 24 and 25 are in contact.

Spirals s'2 and s'1 are interrupted in a third so-called switching region associated with a switching device C3. In this third region, spiral s'2 is interrupted between points 30 and 31 and spiral s'1 is interrupted between points 32 and 33. Points 30 and 33 are connected by a metallization 34 formed in the same metal level as the spiral assembly. Points 31 and 32 are connected by a metallization 35 running above or under metallization 34. A hollowing is formed between metallizations 34 and 35. Metallization 35 is deformable so that, when switching device C3 is active, metallizations 34 and 35 are in contact.

When switching devices C1, C2, and C3 are inactive and metallizations 14/15, 24/25, and 34/35 are separated from one another, the inductance is a four-spiral inductance and the current flows between terminals E3 and E4 through a first portion of spiral s'4, metallization 14, a first portion of spiral s'3, metallization 25, a first portion of spiral s'2, metallization 34, spiral s'1, metallization 35, the second portion of spiral s'2, metallization 24, the second portion of spiral s'3, metallization 15, and finally the second portion of spiral s'4.

When switching device C1 is active, metallizations 14 and 15 are interconnected. Spirals s'1 to s'3 are short-circuited. Only spiral s'4 is active and the inductance is a one-spiral inductance.

When switching device C2 is active and switching device C1 is inactive, metallizations 24 and 25 are connected and metallizations 14 and 15 are separated. Spirals s'1 and s'2 are short-circuited. Spirals s'3 and s'4 are active and the inductance is a two-spiral inductance.

When switching device C3 is active and switching devices C1 and C2 are inactive, metallizations 34 and 35 are connected and metallizations 14/15 and 24/25 are separated. Spiral s'1 is short-circuited. The other spirals s'2, s'3, and s'4 are active and the inductance is a three-spiral inductance.

Figure 4:
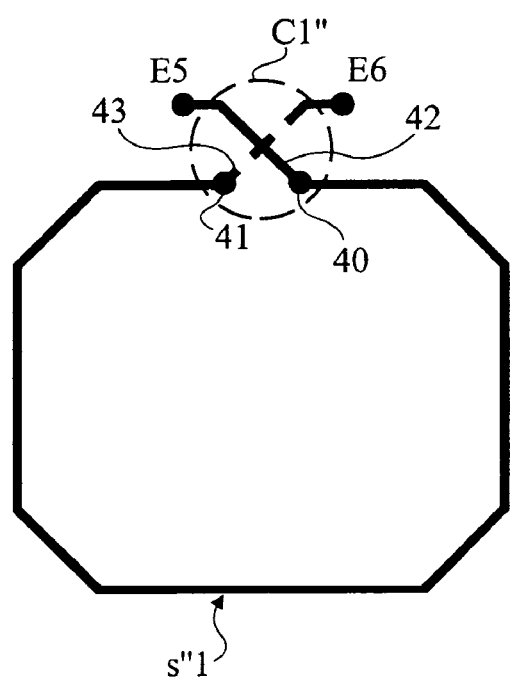
FIG. 4 is a simplified top view of a switchable inductance according to another embodiment of the present invention.

FIG. 4 is a simplified top view of an inductance according to another embodiment of the present invention. This inductance comprises a single spiral s"1. Spiral s"1 is interrupted between two points 40 and 41 in a switching region associated with a switching device C1". Point 40 is connected to a terminal E5 via a metallization 42 formed on the same metal level as that used for spiral s"1. Point 41 is connected to a terminal E6 via a metallization 43 running above or under metallization 42. A hollowing is formed between metallizations 42 and 43. Metallization 43 is deformable so that, when switching device C1" is active, metallizations 42 and 43 are in contact.

When switching device C1" is active, spiral s"1 is short-circuited. Terminals E5 and E6 are connected to each other. The inductance seen between terminals E5 and E6 is substantially zero. When switching device C1" is inactive, the inductance is a one-spiral inductance.

Figure 5:
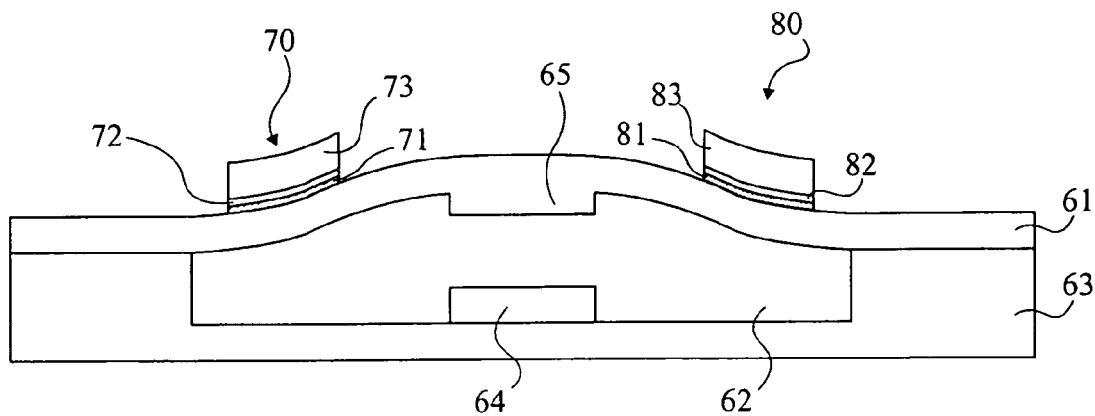
FIG. 5 is a cross-section view of an example of a switching device used in an inductance according to the present invention, the switching device being in the "inactive" state.
Figure 6:
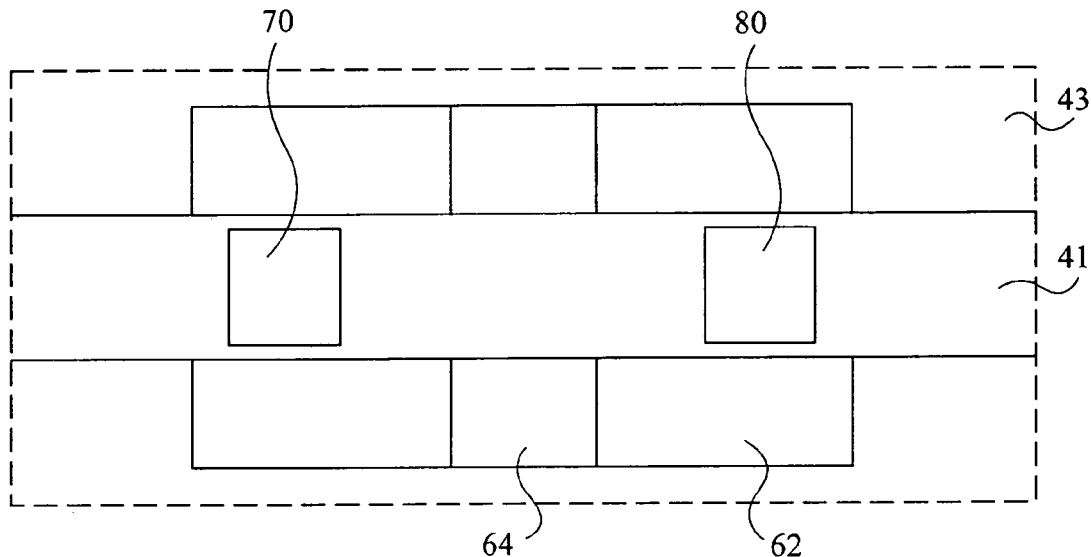
FIG. 6 is a top view of the device shown in FIG. 5.
Figure 7:
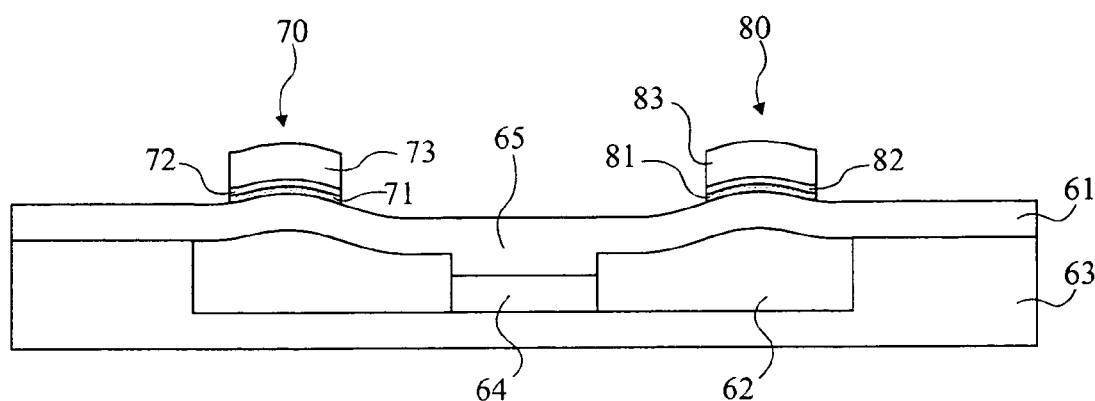
FIG. 7 is a cross-section view of the device of FIGS. 5 and 6 in the "active" state.

FIGS. 5, 6, and 7 show a switching device that can be used in an inductance according to the present invention. FIGS. 5 and 7 are cross-section views of the switching device and FIG. 6 is a top view. A conductive beam 61 is suspended above a cavity 62 formed in a substrate 63. A strip 64 of a conductive material is placed at the bottom of cavity 62. Conductive strip 64 is placed substantially perpendicular to beam 61, as shown in FIG. 6. A conductive pad 65 is placed under beam 61 above conductive strip 64. In an inductance according to the present invention, strip 64 and conductive beam 61 correspond for example to metallizations 6 and 7 of FIG. 2.

The switching device comprises means for deforming beam 61 to put in contact conductive pad 65 and strip 64. When the switching device is in the inactive state, as shown in FIG. 5, the portion of beam 61 located above cavity 62 is in this example slightly bulged upwards. Conductive pad 65 is distant from conductive strip 64. When the switching device is in the active state, as shown in FIG. 7, beam 61 is deformed so that conductive pad 5 is in contact with conductive strip 4.

The means used to deform the beam are, for example, means acting by bimetal effect. Thus, in this example, two multilayer blocks 70 and 80 are placed above the portion of beam 61 located above cavity 62 on either side of conductive pad 65. Each block comprises an insulating layer 71, 81, laid on beam 61. Insulating layers 71, 81 are covered with conductive layers 72, 82. Conductive layers 72, 82 are covered with layers 73 and 83 of a material having an expansion coefficient different from that of beam 61.

To switch from the inactive to the active state, such as respectively illustrated in FIGS. 5 and 7, an activation circuit, not shown, conducts current through conductive layers 72 and 82, which results in heating layers 73, 83 and beam 61. Since layers 73 and 83 have in this example an expansion coefficient greater than that of beam 61, layers 73 and 83 extend more than beam 61. Accordingly, the portions of beam 61 located close to the walls of cavity 62 slightly bulge upwards and the central portion of beam 61 hollows downwards.

Conductive beam 61, conductive pad 65, and conductive strip 64 are formed of a conductive material such as aluminum or copper. Further, to establish a good contact between conductive strip 64 and conductive pad 65, they will preferably be formed at least partly with a non-oxidizable material such as gold.

Substrate 63 may be an insulating layer. In a first configuration example, substrate 63 is the insulating layer separating the last and the penultimate connection level of the interconnect network of an integrated circuit. Conductive strip 64 may be formed on the penultimate connection level and conductive beam 61 may be formed on the last connection level. The inductive line of a device according to the present invention is then formed on the last or the penultimate connection level. In another configuration example, the insulating layer is formed above the last connection network of the interconnect network of an integrated circuit. The conductive strip is formed on the last connection level. The inductive line of a device according to the present invention is then formed in majority on the last connection level.

Insulating layers 71, 81 may be formed of silicon oxide or of an insulating material such as those currently used to form the insulating layers between connection levels of the interconnect network.

Conductive layers 72 and 82 are for example formed of titanium.

Layers 73 and 83 are formed of a material exhibiting a high thermal expansion coefficient, generally a metal layer.

According to an alternative embodiment of the switching device such as described hereabove, conductive beam 61 may be surrounded with an insulating layer in which are formed layers 71 and 81 of blocks 70 and 80.

According to another alternative embodiment of the switching device, conductive beam 61 is replaced with a beam of an insulating material such as silicon nitride SiN in which or under which is formed a conductive line, for example, made of copper or aluminum which is connected to conductive pad 65. The conductive line corresponds to a metallization of the device of the present invention enabling connection of two spirals. The beam deformation device comprises two heating resistors in the form of two conductive layers, for example, made of nitride, placed in the beam. Blocks of a material such as aluminum having a thermal expansion coefficient different from that of the insulating material of the beam are placed on, under, or around the beam close to the heating resistors.

Of course, the present invention is likely to have various alterations, modifications, and improvements which will readily occur to those skilled in the art. In particular, those skilled in the art will readily provide other switching devices. Further, in the above-described switching devices, it may be provided to maintain the beam deformation when the switching device is active, by using means consuming less power than that consumed by the current flow in conductive layers 72 and 84. For this purpose, electrodes may be placed under beam 61 and electrodes may be placed at the bottom of cavity 62 opposite to one another. Once the beam has been deformed under the action of the bimetal effect, it is possible to maintain the deformation by electrostatic attraction by applying a voltage between the electrodes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A switchable inductance that can be formed in an integrated circuit, comprising:
   a spiral interrupted between two first points connected to two terminals via two metallizations running one above the other, one of the two metallizations being deformable;
   a hollowing between the two metallizations; and
   a switching device capable of deforming the deformable metallization to separate or to put in contact said two metallizations.

2. The inductance of claim 1, wherein the switching device comprises:
   a cavity formed in a substrate;
   a conductive beam in suspense above the cavity, the conductive beam being the deformable metallization;
   a conductive strip placed at a bottom of the cavity, the conductive strip being the other one of said metallizations; and
   means for deforming the beam capable of putting in contact the beam and the conductive strip.

3. The inductance of claim 2, wherein the beam deformation means comprise multilayer blocks placed on the beam, each block comprising a conductive layer placed between an insulating layer and a layer of a material having an expansion coefficient different from that of the beam, activation means being capable of conducting a current in the conductive layer of each block to heat the beam and said material layer of each block.

4. The inductance of claim 1, comprising a second spiral, the second spiral being interrupted between two second points connected to said terminals, the external spiral being interrupted and connected to connection terminals.

5. The inductance of claim 4, wherein the inductance comprises additional spirals, each of which is associated with another spiral by crossed metallizations, one of which is deformable and associated with one of the switching devices.

6. A switchable inductance comprising:
   a substrate;
   one or more interrupted spirals in the substrate;
   a first electrical connection between a first point of the one or more interrupted spirals and a third point;
   a second movable electrical connection between a second point of the one or more interrupted spirals and a fourth point, the second movable connection positioned adjacent to the first electrical connection in a non-parallel arrangement and configured to make selective electrical contact with the first connection to alter an inductance value of the switchable inductance; and
   a conductor connected to the second movable electrical connection and that causes the second movable connection to move relative to the first connection when current is passed through the conductor.

7. The inductance of claim 6, wherein the first fixed electrical connection and the second movable electrical connection are positioned in a cavity of the substrate.

8. The inductance of claim 6, wherein the conductor moves the second movable connection into contact with the first connection when current is passed through the conductor.

9. The inductance of claim 6, wherein the conductor is sandwiched between the second movable electrical connection and a heating layer that has a different coefficient of thermal expansion than the second movable electrical connection.

10. The inductance of claim 9, wherein the coefficient of thermal expansion of the heating layer is greater than that of the second movable electrical connection.

11. The inductance of claim 9, wherein the conductor is separated from the second movable electrical connection by an insulating layer.

12. A switchable inductance comprising:

means for providing a current pathway through one or more interrupted spirals in a substrate, the pathway associated with a first inductance value;

means for providing a movable electrical connection that is positioned to short circuit one of the one or more interrupted spirals when the movable electrical connection is moved into contact with an adjacent portion of the current pathway; and means for providing current flow through a conductor that is connected to the movable electrical connection to cause the movable electrical connection to contact the adjacent portion of the current pathway, thereby altering the pathway so as to define a second inductance value different than the first inductance value.

* * * * *